(12) United States Patent
Hayakawa (10) Patent No.: US 6,857,888 B2
(45) Date of Patent: Feb. 22, 2005

(54) SOCKET FOR ELECTRICAL PARTS (75) Inventor: Kenji Hayakawa, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 26 days.

(21) Appl. No.: 10/305,128

(22) Filed: Nov. 27, 2002

(65) Prior Publication Data

US 2003/0104717 A1 Jun. 5, 2003

(30) Foreign Application Priority Data

Nov. 30, 2001 (JP) ........................................ 2001-366131

(51) Int. Cl.[7] .............................................. H01R 11/22
(52) U.S. Cl. ...................................................... 439/266
(58) Field of Search ................................ 439/266, 263, 439/264, 268

(56) References Cited

U.S. PATENT DOCUMENTS 5,669,780 A * 9/1997 Fukunaga .................... 439/266
5,807,127 A * 9/1998 Ohshima ..................... 439/266
6,280,219 B1 * 8/2001 Sano et al. .................. 439/268

* cited by examiner

Primary Examiner—Phuong Dinh
(74) Attorney, Agent, or Firm—Staas & Halsey LLP (57) ABSTRACT A socket for an electrical part has a socket body to which an IC package as an electrical part is accommodated, the socket body being provided with a number of contact pins which are contacted to or separated from solder balls as terminals of the electrical part, a movable member arranged to be movable with respect to the socket body, and lever members mounted to both sides of the socket body to be rotatable. In this structure, when the lever members are rotated, the movable member is moved to displace the contact pins so as to be contacted to or separated from the solder balls of the electrical part, respectively. In such structure, each of the lever members are formed with pressing portion which acts to press a portion of the movable member in accordance with the rotation of the lever members and when the movable member is moved so as to approach a lowermost position thereof by the rotation of the lever member, the pressing portion and the pressed portion achieves surface-to-surface contact to each other.

20 Claims, 13 Drawing Sheets

SOCKET FOR ELECTRICAL PARTS

BACKGROUND OF THE INVENTION

1. Field of The Invention

The present invention relates to a socket for an electrical part for detachably holding an electrical part such as semiconductor device (called "IC package" hereinlater).

2. Related Art of the Invention

In a known art, there has been provided an IC socket, as "socket for an electrical part" of a kind mentioned above, for accommodating an IC package as "electrical part".

In such IC package, a number of solder balls as "terminals" are provided so as to project from a lower surface of the IC package and these solder balls are arranged in lattice having vertical and horizontal rows.

On the other hand, the IC socket has a socket body into which the IC package is accommodated and to which a number of contact pins contacting the terminals of the IC package are arranged. The socket body is also provided with a movable member, which is urged upward to be vertically movable by means of coil spring, for elastically deforming the contact pins so as to be contacted to or separated from the terminals of the IC package, respectively.

Furthermore, a lever member for vertically moving this movable member is attached to the socket body to be pivotal or rotatable about a rotational shaft and an operation member for rotating this lever member is also mounted to the socket body to be vertically movable.

Through the vertical movement of the operation member, the lever member is rotated and the movable member is then moved vertically. Accordingly, the contact pins are elastically deformed and contact portions of the contact pins are contacted to or separated from the terminals of the IC package.

However, In such conventional structure, the lever member is made of metal material, the movable member is made of synthetic resin, and the lever member has a pressing (pushing or depressing) portion which presses the movable member and provides an R-shape, and on the contrary, the movable member has a portion to be pressed (pushed or depressed) by the pressing portion of the lever member, which provides a flat surface shape. Therefore, the pressing portion of the lever member is always linearly contacted (i.e., achieves a line contact) to the movable member.

Because of the above reason, as the lever member is rotated so as to move the movable member downward, a stress directing upward acting to the movable member is increased by a reaction force of the coil spring which urges the movable member upward, and this stress becomes maximum at a time when the movable member is pressed downward to the most downward position (lowest position of the movable member). If an IC socket having such structure is used repeatedly, the pressed portion of the movable member made of synthetic resin will be worn or broken because the movable member is made of synthetic resin where as the lever member is made of metal material. The wearing or breaking of the pressed portion of the movable member will result in the reduction of the lowering amount of the movable member and, hence, an opening degree of the contact portion of the contact pin cannot be ensured to an amount capable of receiving the solder ball in the contacting/separating manner.

SUMMARY OF THE INVENTION

An object of the present invention is therefore to substantially eliminate defects or drawbacks encountered in the prior art mentioned above and to provide a socket for an electrical part capable of preventing a pressed portion of a movable member of a socket body from being worn or broken and ensuring a suitable moving amount of the movable member.

This and other objects can be achieved according to the present invention by providing, in a general aspect, a socket for an electrical part having a socket body to which an electrical part is accommodated, the socket body being provided with a number of contact pins which are contacted to or separated from terminals of the electrical part, a movable member arranged to be movable with respect to the socket body, and a lever member mounted to the socket body to be rotatable, in which when the lever member is rotated, the movable member is moved to thereby displace the contact pins so as to be contacted to or separated from the terminals of the electrical part, respectively, wherein the lever member is formed with a pressing portion which acts to press a portion of the movable member in accordance with the rotation of the lever member and when the movable member is moved so as to approach a lowermost position thereof by the rotation of the lever member, the pressing portion of the lever member and the pressed portion of the movable member achieves surface-to-surface contact to each other.

In a preferred embodiment of this aspect, the socket body is further provided with an operation member so as to be vertically movable with respect thereto, and when the operation member is lowered in the vertical direction, the lever member is rotated and the movable member is moved to thereby displace the contact pins by the rotation of the lever member so as to be contacted to or separated from the terminals of the electrical part.

The lever member is formed from metal plate, the movable member is formed from synthetic resin, the pressed portion of the movable member is formed with a flat surface portion and the pressing portion of the lever member is formed with a flat surface portion so that when the lever member is rotated to move the movable member so as to approach the lowermost position, the flat surface portion of the pressing portion of the lever member and the flat surface portion of the pressed portion of the movable member achieves surface-to-surface contact to each other.

According to the present invention of the described aspect, when the movable member is moved so as to approach a lowermost position thereof by the rotation of the lever member, the pressing portion of the lever member and the pressed portion of the movable member achieve surface-to-surface contact to each other. Accordingly, in comparison with a prior art in which these portions are contacted linearly, i.e., line-to-line contact, the applied force can be dispersed and, hence, a pressure (force) acting on to the pressed portion can be reduced. Moreover, since the movable member is formed from synthetic resin, the wearing and damaging of the pressed portion of the movable member can be effectively suppressed. Therefore, even in repeated operation, the maximum lowering amount of the movable member can be ensured.

In another more structural aspect, there is provided a socket for an electrical part comprising:

a socket body to which an electrical part is mounted and provided with a number of contact pins to be contacted to or separated from terminals of the electrical part;

a movable member mounted to the socket body to be vertically movable with respect thereto; and a lever member mounted to the socket body to be rotatable, the lever member being formed with a pressing portion and the movable member being formed with a portion to be pressed by the pressing portion of the lever member when the lever member is rotated and the movable member approaches the lowermost position of the movable member in a vertical movement direction thereof, the pressing portion of the lever member and the pressed portion of the movable member achieve surface-to-surface contact to each other.

In a preferred embodiment of this aspect, the socket may further comprise an operation member mounted to the socket body to be vertically movable, and in this embodiment, the operation member is lowered in the vertical direction thereof, the lever member is rotated and the movable member is then moved.

The pressed portion of the movable member is formed with a flat surface portion and the pressing portion of the lever member is formed with a flat surface portion so that when the lever member is rotated to move the movable member, the flat surface portion of the pressing portion of the lever member and the flat surface portion of the pressed portion of the movable member achieve surface-to-surface contact to each other.

The lever member includes two set of paired levers, each set of which is arranged to one side of the socket, the paired levers provide an X-shape in arrangement and are pivotal about shafts formed to the socket body, the paired levers being provided with pressing portions and the movable member being formed with portions to be pressed by the pressing portions of the levers when the levers are rotated.

Guide wall sections are formed to respective side of the socket body so as to cover the paired levers on both the sides to prevent the levers from coming off from the socket body.

In this aspect, substantially the same effects and functions as mentioned above can be achieved.

Further, in the described embodiment, it is preferred that the socket is an IC socket and the electrical part is an IC package.

The nature and further characteristic features of the present invention will be made more clear from the following descriptions made with reference to the accompanying drawings.

BRIEF DESCRIPTION OF THE DRAWINGS

In the accompanying drawings:

FIG. 10, including

FIG. 11, including

FIG. 12 includes FIG. 12A of a sectional view showing a state that the contact portion of the contact pin of the IC socket of the present invention is closed and FIG. 12B of a sectional view, in an enlarged scale, of an essential portion of FIG. 12A; and FIG. 13 includes FIG. 13A of a sectional view showing a state that the contact portion of the contact pin of the IC socket of the present invention is opened and FIG. 13B of a sectional view, in an enlarged scale, of an essential portion of FIG. 13A.

DESCRIPTION OF THE PREFERRED EMBODIMENT

A preferred embodiment of the present invention will be described hereunder with referenced to FIGS. 1 to 13.

In the drawings, reference numeral 11 denotes an IC socket as "socket for an electrical part". This IC socket 11 is a socket for achieving an electrical connection between a solder ball 12b as "terminal" of an IC package 12 as "electrical part" and a printed circuit board, not shown, of a tester for carrying out a performance test of the IC package 12.

Figure 10A:
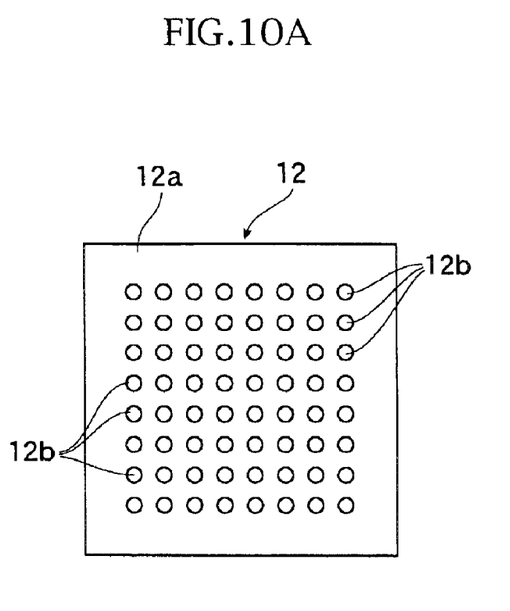
FIGS. 10A and 10B, represent an IC package to be mounted to the IC socket according to the embodiment of FIG. 1, FIG. 10A being a bottom view thereof and FIG. 10B being a left side view of FIG. 10A.
Figure 10B:
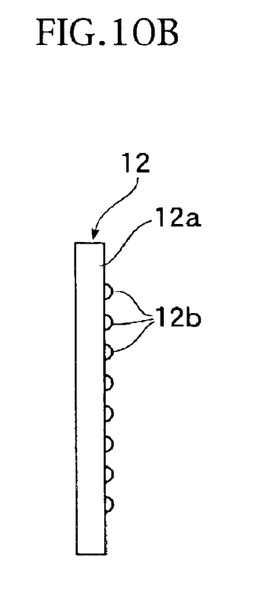

The IC package 12 is so-called a BGA (Ball Grid Array) type, as shown in FIGS. 10A and 10B, in which a number of spherical solder balls 12b are arranged on a lower surface of a square package body 12 of the IC package 12 in form of matrix including vertical and horizontal rows.

Figure 2:
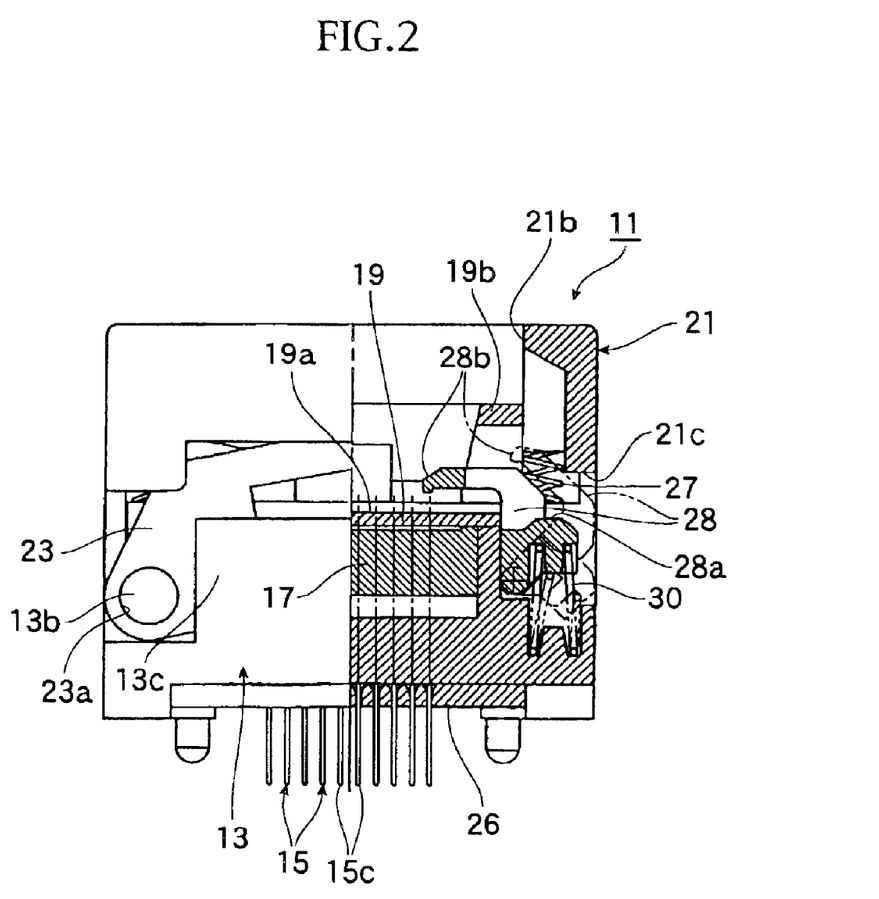
FIG. 2 is a front view, half in section, of the IC socket of the embodiment of FIG. 1.

On the other hand, the IC socket 11 comprises, as shown in FIG. 2, a socket body 13 which is made of synthetic resin, mounted on the printed circuit board to which contact pins 15 are arranged so as to be contacted to or separated from solder balls 12b of the IC package 12, respectively. To the socket body 13, is also arranged a movable member 17 for displacing the contact pin 15, and a top plate 19 is fixed to the socket body 13 at an upper side of the movable member 17. An operation member 21 for moving the movable member 17 in the vertical direction is also arranged to the socket body 13.

Figure 5:
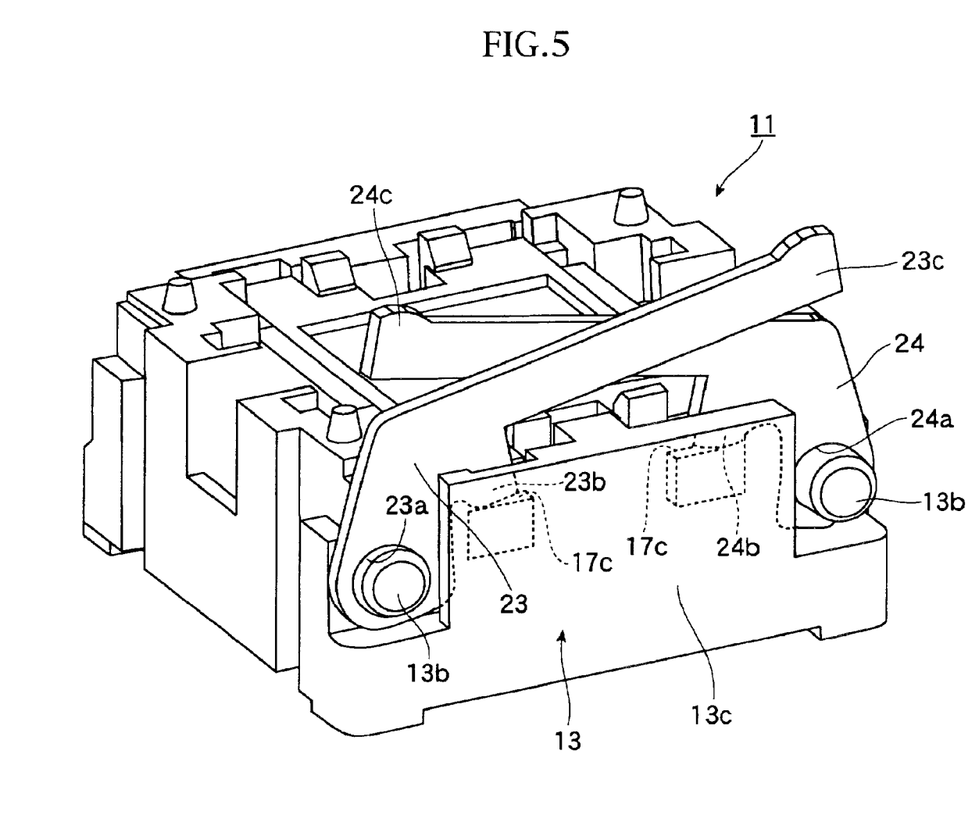
FIG. 5 is a perspective view of the IC socket from which an operation member is removed.

Further, it is to be noted that terms such as "upper", "lower", "right", "left" and the like terms are herein used in an illustrated state or usually usable state such as shown in FIG. 5.

The contact pin 15 is formed by press-working a plate member having elasticity (springy property) and conductive property so as to provide shapes shown in FIGS. 11A to 11D.

Figures 11A, 11D:
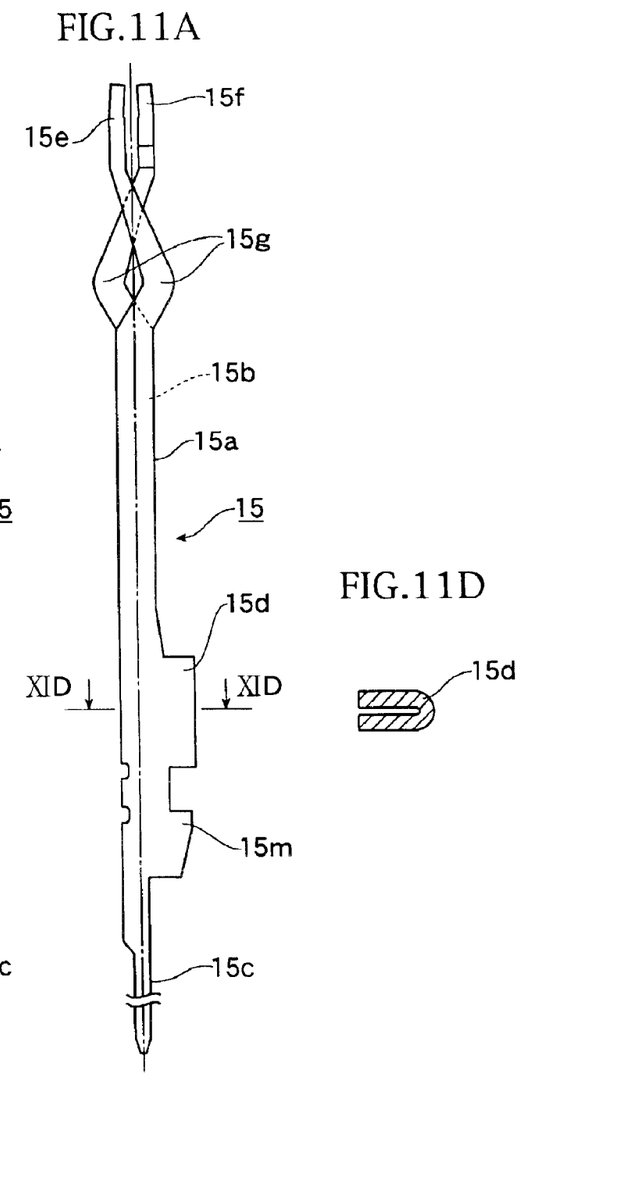
FIGS. 11A, 11B, 11C and 11D, represent a contact pin according to the embodiment of the IC socket of the present invention, FIG. 11A being a front view thereof, FIG. 11B being a side view of FIG. 11A, FIG. 11C being a plan view of FIG. 11A and FIG. 11D being a sectional view taken along the line XID—XID in FIG. 11A.
Figure 11B:
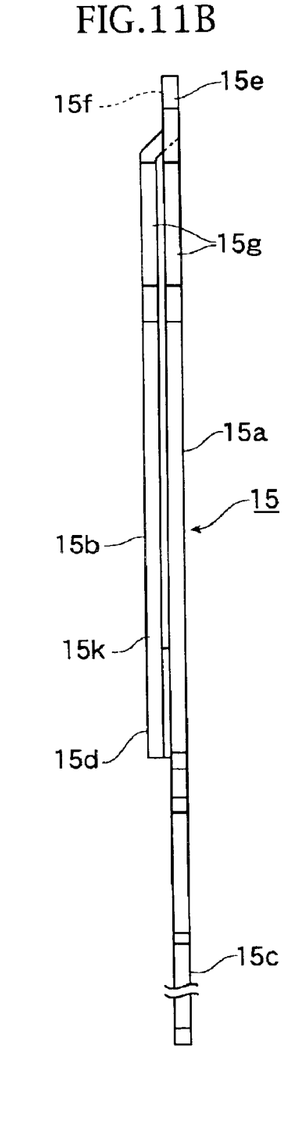
Figure 11C:
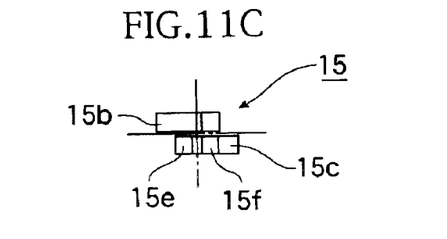

More in detail, the contact pin 15 is composed of an upper pair of elastic pieces 15a and 15b and a lower single solder tail portion 15c, and the elastic pieces 15a and 15b are connected at their lower end portions through a base portion 15d having a U-shape as shown in FIG. 11D so that the paired elastic pieces 15a and 15b are opposed to each other. Furthermore, contact portions 15e and 15f are formed to the upper (i.e., front), as viewed, end portions of the elastic pieces 15a and 15b so as to clamp the solder ball 12b between these contact portions 15e and 15f to establish an electrical connection therebetween. The elastic pieces 15*a* and 15*b* is formed with bent portions 15*g* substantially in "<"-shape. When these bent portions 15*g* are pressed by a cam portion 17*a*, mentioned hereinlater, of the movable member 17, the contact portions 15*e* and 15*f* are opened.

The solder tail portion 15*c* and the base portion 15*d* of each of the contact pins 15 of the structure mentioned above are inserted, as shown in FIGS. 12A, 12B and FIGS. 13A, 13B, into a fit-in hole 13*a* formed to the socket body 13, and a coming-off prevention portion 15*m* formed to the base portion 15*d* bites the socket body 13 so as to prevent the contact pin 15 from coming off upward. The solder tail portion 15*c* extending downward from the socket body 13 further projects downward through a location board 26, as shown in FIGS. 2 and 3, and is then inserted into a through hole formed to the printed circuit board, not shown, and soldered, thus completing the connection.

Figure 1:
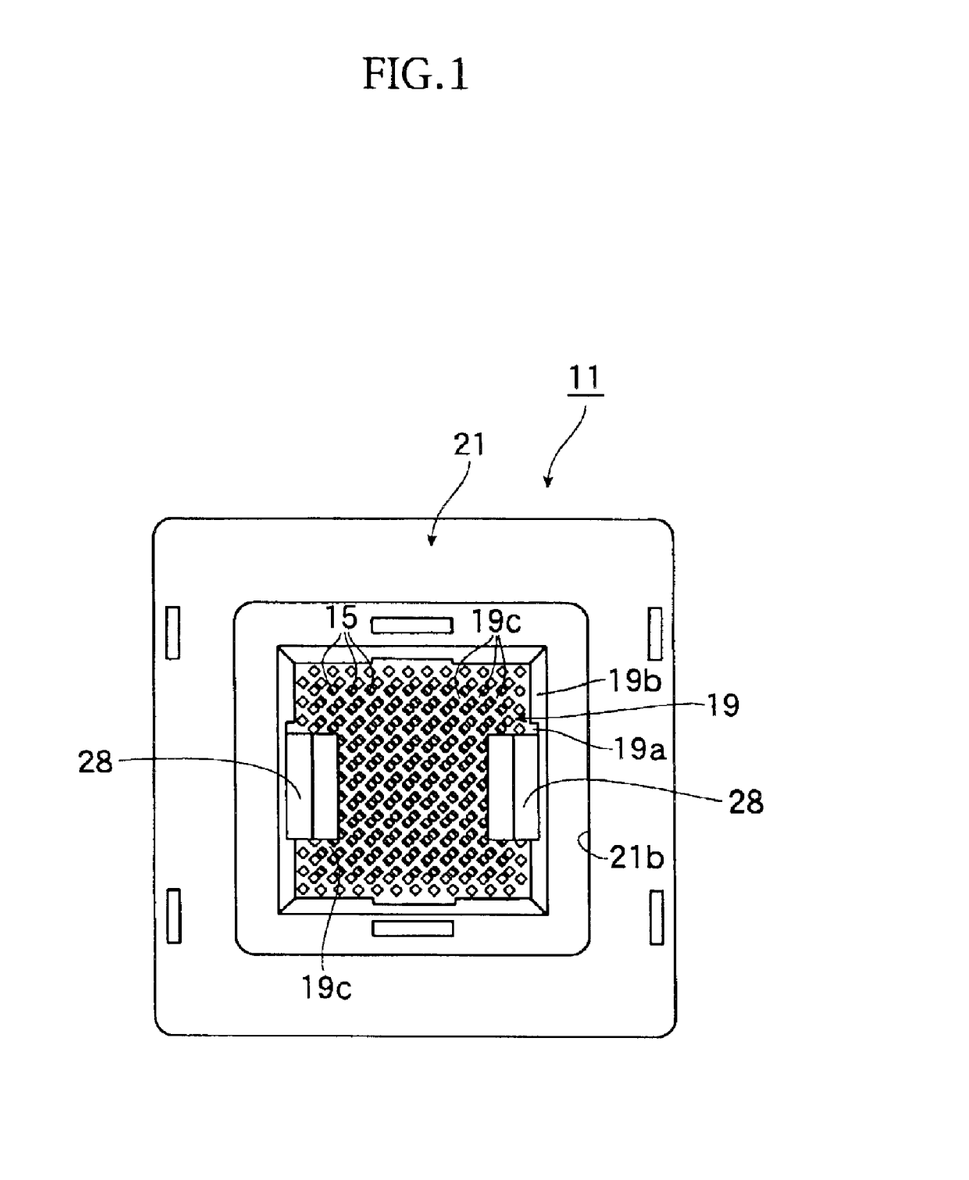
FIG. 1 is a plan view of an IC socket according to an embodiment of the present invention.

A number of such contact pins 15 are arranged, as shown in FIG. 1, in form of matrix comprising vertical and horizontal rows so as to accord with the arrangement of the solder balls 12*b* of the IC package 12.

Figure 3:
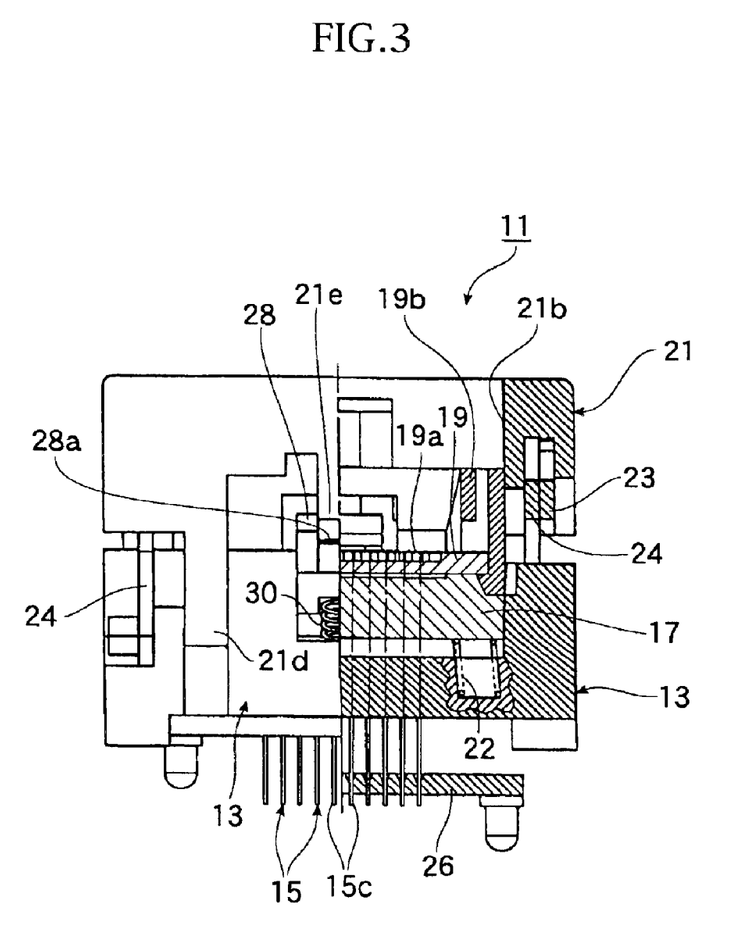
FIG. 3 is a side view, half in section, of the IC socket of the embodiment of FIG. 1.

On the other hand, the movable member 17 is formed from synthetic resin material, and as shown in FIG. 3, is mounted to the socket body 13 to be vertically movable, that is, movable in a direction perpendicular to a mount surface 19*a* of a top plate 19, which will be mentioned hereinlater, and urged upward by means of spring 22. The movable member 17 is moved in the vertical direction by first and second lever 23 and 24, as one set which is attached to each of the paired sides of the socket body 13 as shown in FIG. 5. That is, two sets of lever members 23 and 24 are mounted to the side portions of the socket body 13, respectively. Further, in FIG. 5, another one set is eliminated from the illustration. Each set of lever members 23 and 24 provides an X-shape in arrangement.

These first and second lever members 23 and 24 are formed from a metal plate and formed, at their base end portions, with fitting holes 23*a* and 24*a*, into which shaft (shank) portions 13*b* are fitted in projecting manner, the shaft portions 13*b* being integrally formed to the socket body 13, made of synthetic resin, to be rotatable.

Figure 8:
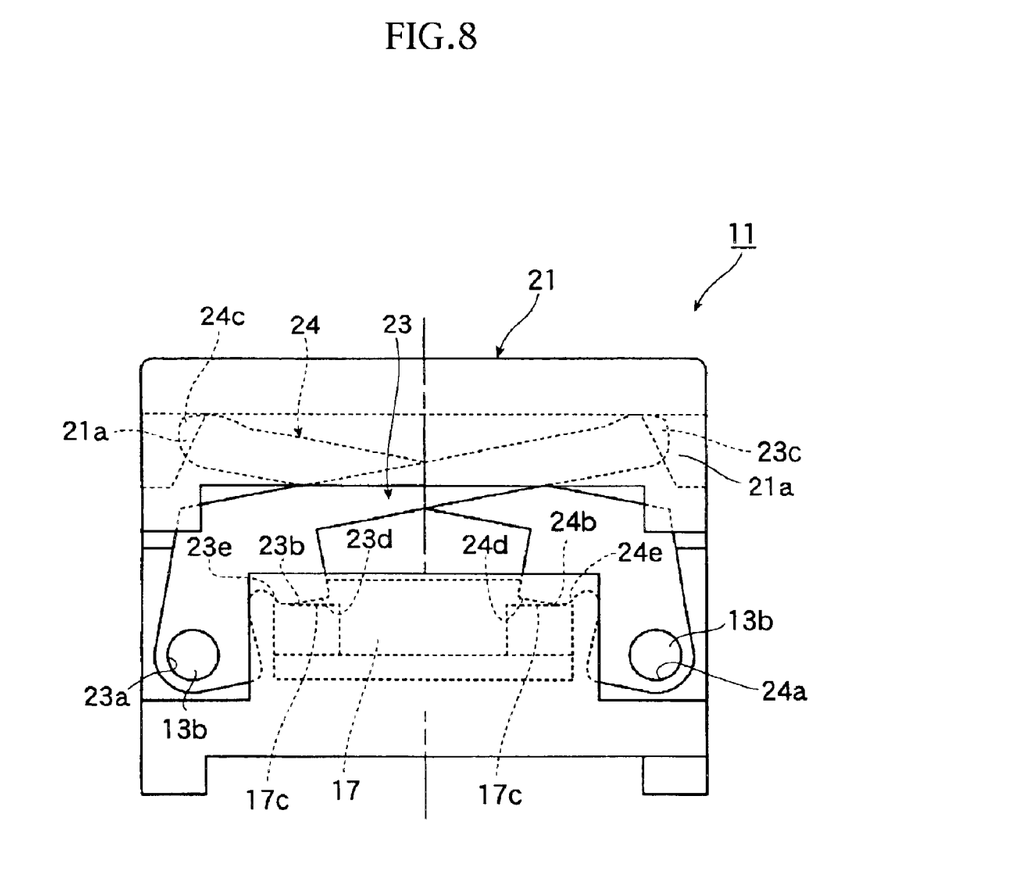
FIG. 8 is a front view showing a state that the operation member of the IC socket, according to the embodiment of the present invention, is positioned at its uppermost position.
Figure 9:
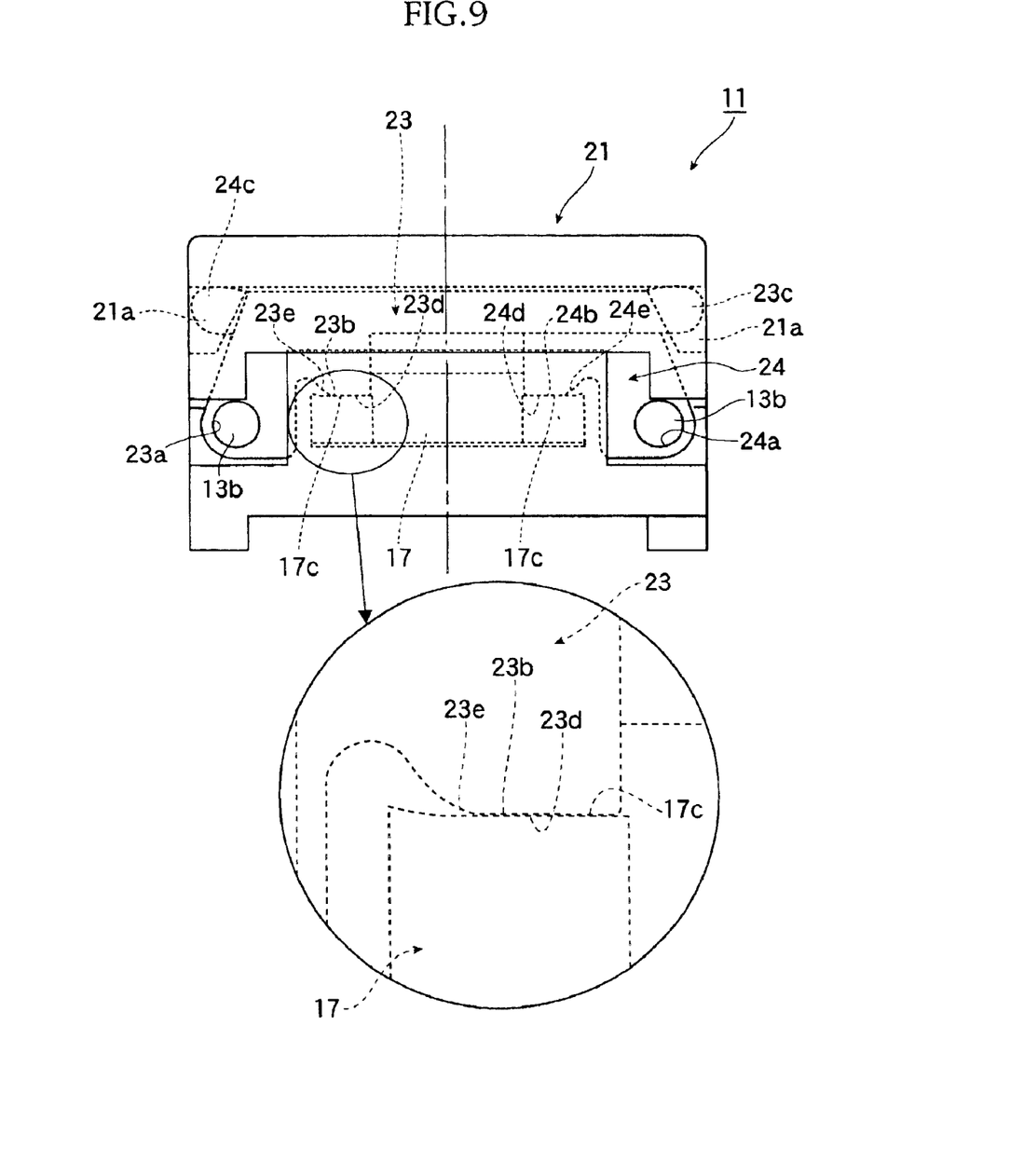
FIG. 9 is a front view showing a state that the operation member of the IC socket, according to the embodiment of the present invention, is positioned at its lowermost position.

Furthermore, as shown in FIGS. 5, 8 and 9, the first and second lever members 23 and 24 are respectively provided, at their base end side portions, with pressing (pushing or depressing) portions 23*b* and 24*b*, which abut against the upper surfaces of flat-shaped pressed portions (portions to be pressed (pushed or depressed)) 17*c* of the movable member 17 and depress them downward.

These pressing portions 23*b* and 24*b* have flat surface portions 23*d* and 24*d* so as to perform surface-to-surface contact between the pressing portions 23*d* and 24*d* and the pressed portions 17*c* of the movable member 17, as shown in FIG. 9, providing that the lever members 23 and 24 are rotated so as to move the movable member 17 to its lowermost position.

Further, as shown in FIG. 5, the socket body 13 is provided with side wall portions 13*c* each guiding the side portions of the base end sides of the lever memebers 23 and 24 so as to prevent both of the lever members 23 and 24 from coming off from the shaft portions 13*b* thereof.

Figure 4:
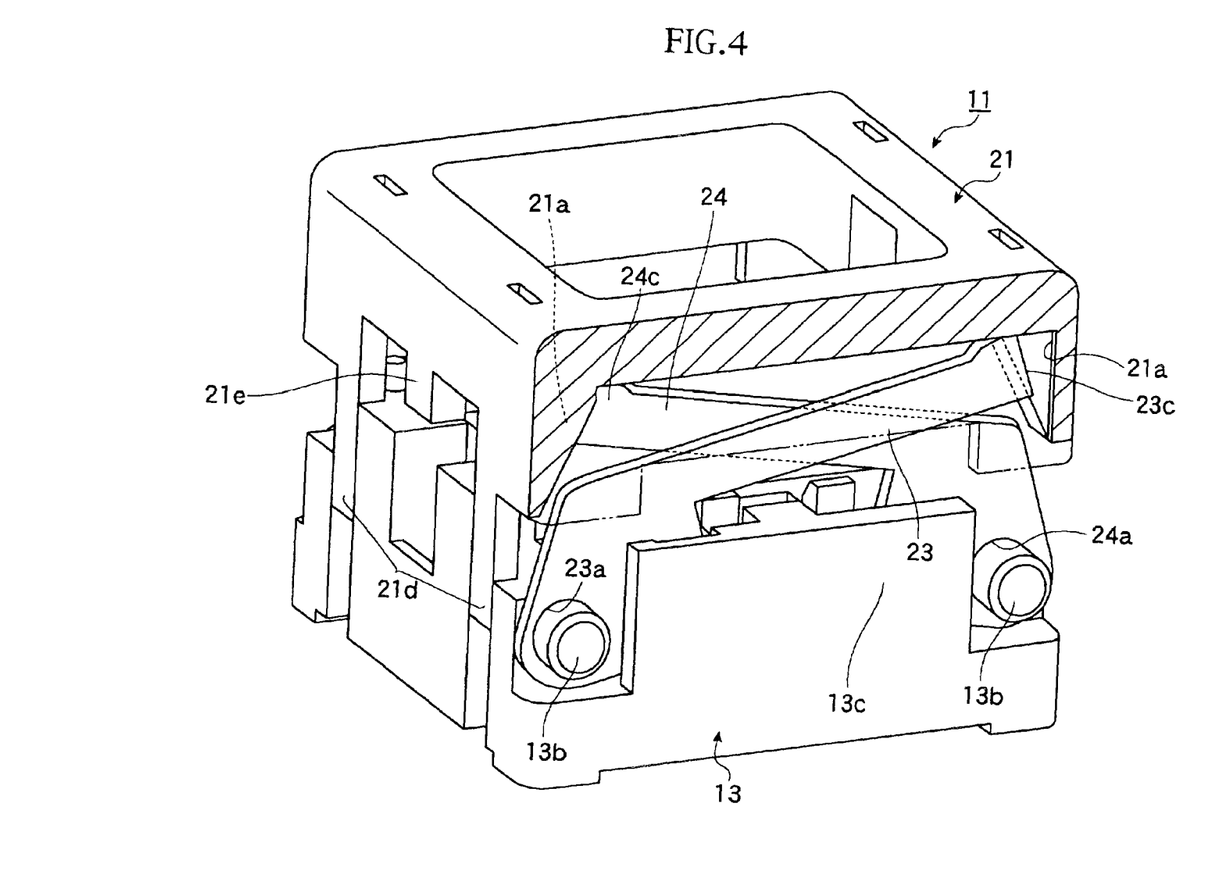
FIG. 4 is a perspective view, partially in section, of the IC socket of the embodiment of FIG. 1.
Figure 6:
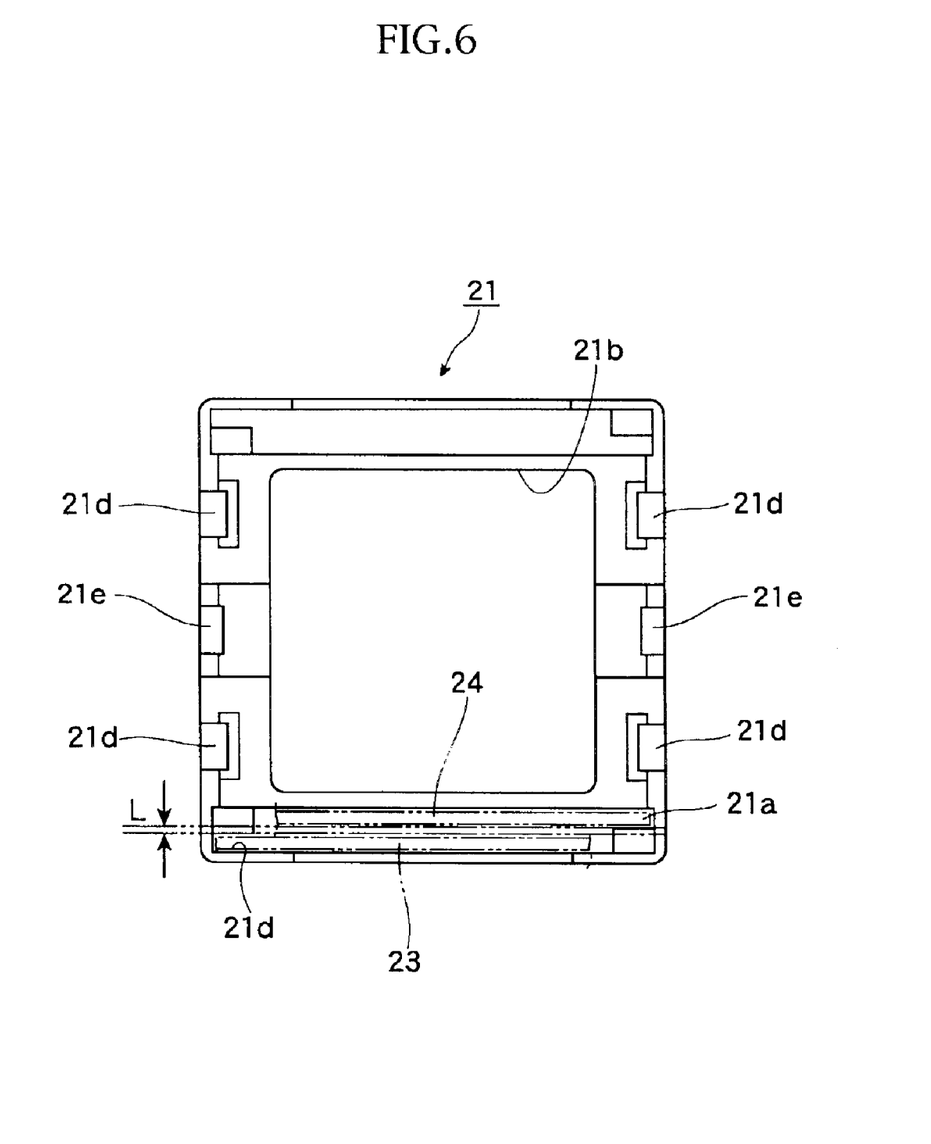
FIG. 6 is a backside view of the operation member of the IC socket of the embodiment of FIG. 1.

Furthermore, these lever members 23 and 24 have front (free) end portions 23*c* and 24*c*, which are fitted into guide grooves 21*a*, as shown in FIG. 4, formed to the rear sides of the operation member 21 so as to prevent the lever members 23 and 24 from falling sideways, the grooves 21*a* being formed, as shown in FIG. 6, with a distance L from each other so as to prevent the lever members 23 and 24 from contacting to each other.

According to the structure mentioned above, when the operation member 21 is lowered, in a state shown in FIG. 4, for example, the lever members 23 and 24 are rotated (pressed) downward and, hence, the pressing portions 23*b* and 24*b* of the lever members 23 and 24 press downward the portions 17*c* of the movable member 17, thus lowering the movable member 17.

Then, with reference to FIGS. 12A, 12B and FIGS. 13A, 13B, the movable member 17 is formed with cam portions 17*a* so as to be each arranged between adjacent contact pins 15. The cam portion 17*a* has sliding surfaces 17*b* formed on both sides thereof so as to contact and press the bent portions 15*g* of the elastic pieces 15*a* and 15*b* of the contact pins 15 adjacent to this cam portion 17*a*. That is, one cam portion 17*a* presses both the bent portions 15*g* of the elastic pieces 15*a* and 15*b* of the adjacent two contact pins 15, and when both the bent portions 15*g* of the paired elastic pieces 15*a* and 15*b* of one contact pin 15 are pressed by the cam portions 17*a* disposed on both sides of this one contact pin 15 in the direction approaching each other, both the contact portions 15*e* and 15*f* of each of the contact pin 15 is moved to be opened from each other.

Figures 12A, 12B:
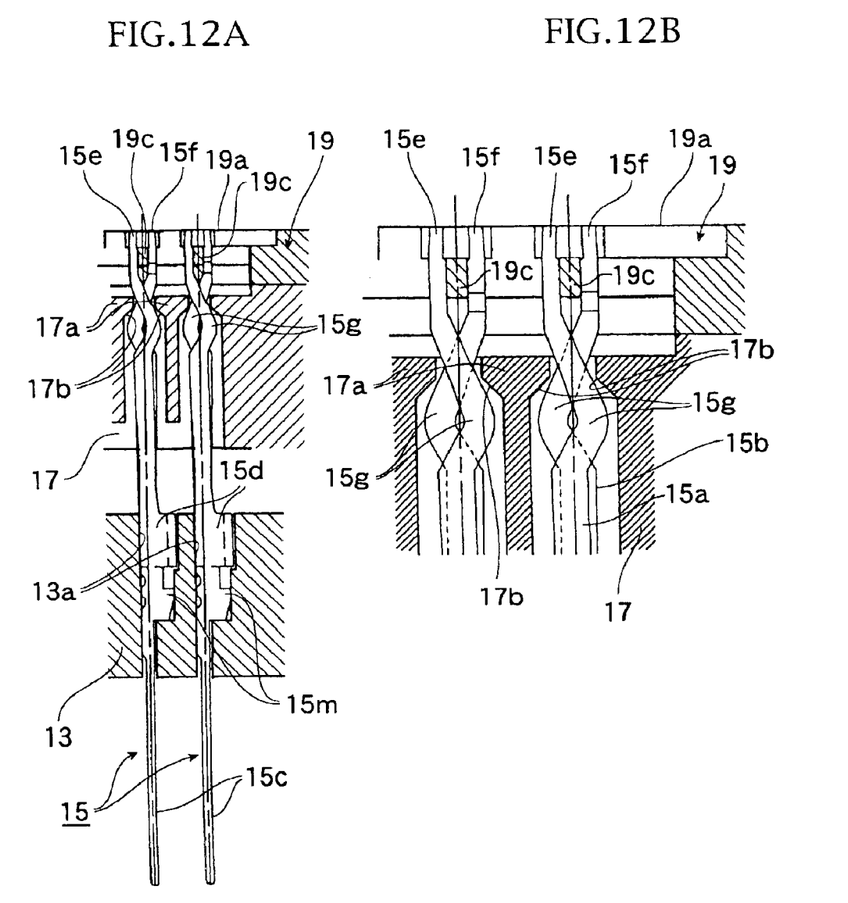

On the other hand, as shown in FIGS. 1 and 3, the top plate 19 is provided with an accommodation surface portion 19*a* on which the IC package 12 is accommodated and with guide portions 19*b* for positioning the IC package 12, on the accommodation surface portion 19*a*, to portions corresponding to a peripheral portion of the package body 12*a*. Furthermore, as shown in FIGS. 12A and 12B, this top plate 19 is provided with positioning ribs 19*c*, each of which is inserted between the paired contact portions 15*e* and 15*f* of each contact pin 15. In a state that no external force is applied to the elastic pieces 15*a* and 15*b* of the contact pin 15 (i.e., a state that the paired contact portions 15*e* and 15*f* are closed), the positioning rib 19*c* is clamped between the elastic pieces 15*a* and 15*b*.

Figure 7:
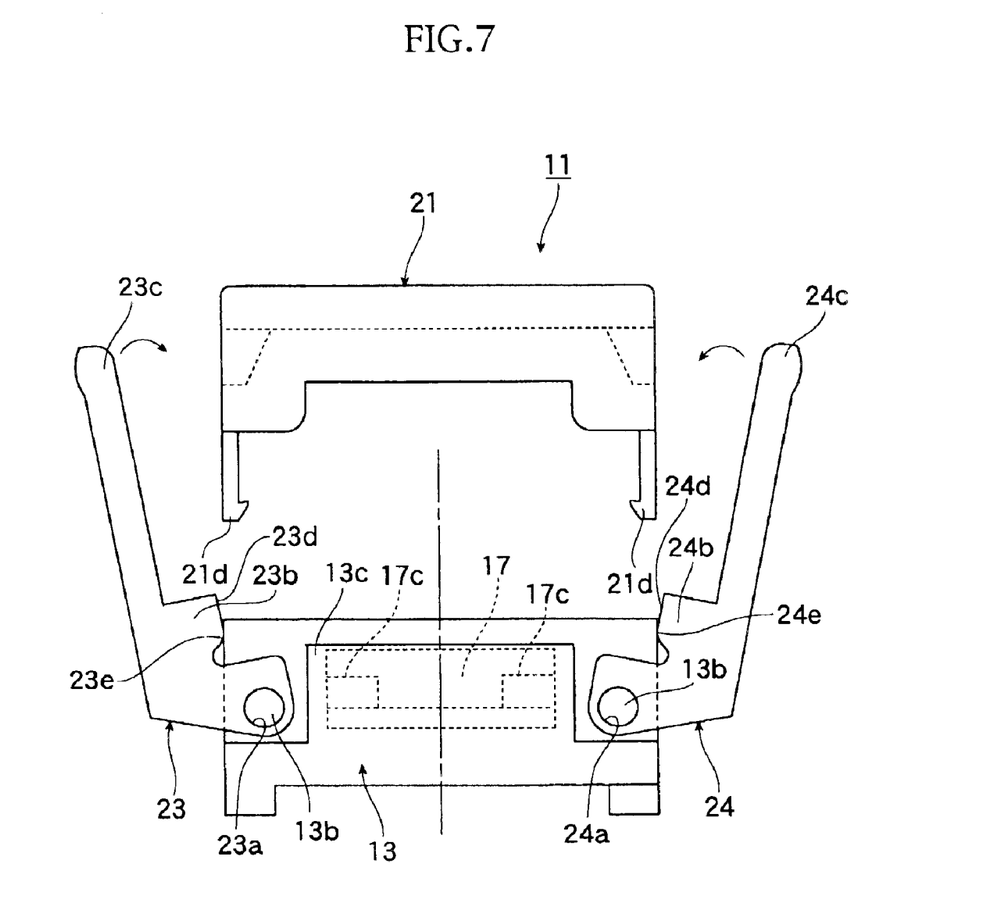
FIG. 7 is an exploded front view showing an assembling state of the IC socket of the embodiment.

Still furthermore, as shown in FIG. 1, the operation member 21 has an opening 21*b* of a size capable of receiving the IC package 12, and through this opening 21*b*, the IC package 12 is inserted and rested on the predetermined position of the accommodation surface portion 19*a* of the top plate 19. This operation member 21 is disposed, as shown in FIG. 2, to be vertically movable with respect to the socket body 13 and is urged upward by means of spring 27. Then, as shown in FIGS. 3 and 7, at the uppermost position of the rising motion of the operation member 21, engaging claw 21*d* is engaged with an engagement portion of the socket body 13 to thereby prevent the operation member 21 from coming off.

In addition, as shown in FIGS. 2 and 3, the operation member 21 is provided with an operating portion 21*e* for rotating a latch 28.

This latch 28 is mounted to the socket body 13 to be rotatable about a shaft or pin though not shown in detail, and as shown in FIG. 2, is urged in a closing direction by means of spring 30. The latch 28 has a front end portion to which a pressing piece 28*b* to thereby press the peripheral edge portion of the IC package 12.

The latch 28 is formed with a slide portion 28*a* on which the operating portion 21*e* of the operation member slides, and when the operation member 21 is lowered, the operating portion 21*e* slides on the slide portion 28*a*. The latch 28 is rotated in a clockwise direction as shown with two-dot chain line in FIG. 2, and the press portion 28*b* is retired from the arrangement position of the IC package 12.

The IC socket 11 of the structure mentioned above will be used in the following manner.

At a time when it is required to set the IC package 12 to the IC socket 11, the operation member 21, in a state, for example, shown in FIG. 4, is depressed downward. Then, the front end portions 23c and 24c of the respective lever members 23 and 24 are also depressed downward by the operation member 21 and are rotated (pivoted) downward about the shafts 13b from the state shown in FIG. 8 to the state shown in FIG. 9. According to this rotating motion, the pressed portions 17c of the movable member 17 are pressed by the pressing portions 23b and 24b of the lever members 23 and 24 and the movable member 17 is then lowered against the urging force of the spring 22.

In the described movement, as shown in FIG. 9, when the lever members 23 and 24 are rotated and the movable member 17 approaches its lowermost position (most depressed position), the flat surface portions 23d and 24d of the pressing portions 23b and 24b of the lever members 23 and 24 abut against the depressed portions 17c of the movable member 17 and achieve the surface-to-surface contact. In regard to this most depressed position, in a prior art in which a pressing portion of a lever member linearly contacts a movable member, a reaction force becomes maximum. However, in the present invention, the surface-contacting state is realized, the contacting force is much dispersed in comparison with the prior art and a pressure acting on the pressed portion 17c is made smaller, so that the pressed portion 17c of the movable member 17 made of synthetic resin is free from being worn or damaged, and accordingly, the maximum lowering amount of the movable member 17 is not reduced as in the prior art and a required lowering amount can be ensured.

In addition, according to the described embodiment of the present invention, the flat-surface portions 23d and 24d are only formed to the pressing portions 23b and 24b of the lever members 23 and 24 through a press working, so that the forming working is not made complicated in comparison with a conventional art, and moreover, it is not necessary for the lever members 23 and 24 to be formed with a large thickness, thus effectively utilizing a location space.

Figures 13A, 13B:
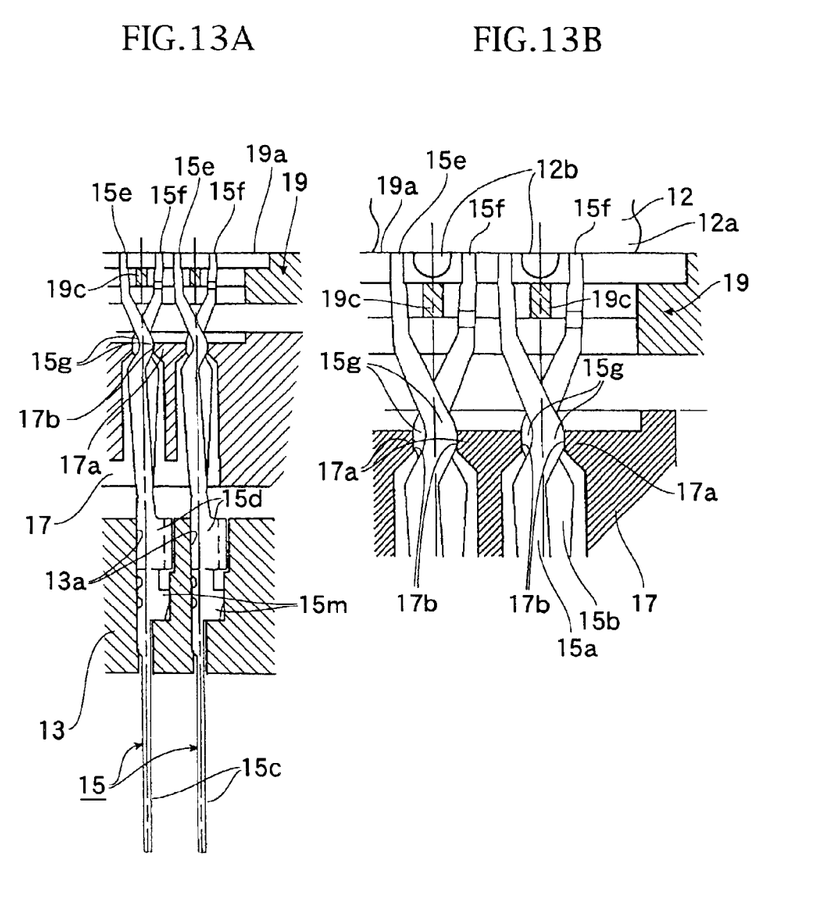

Furthermore, as described, when the movable member 17 is lowered, the cam portions 17a are also lowered from the state shown in FIGS. 12A and 12B to the state shown in FIGS. 13A and 13B and both the bent portions 15g of the contact pin 15 are pressed and the paired contact portions 15e and 15f of the contact pin 15 are opened as shown in FIGS. 13A and 13B.

At the same time, the pressed portion 28a of the latch 28 is also depressed by the operating portion 21e of the operation member 21 and rotated against the urging force of the spring in the opening direction thereof from the state shown with solid line in FIG. 2 to the state shown with two-dot chain line, and the latch 28 is moved so that the portion 28b is displaced to its retired position.

Under the state mentioned above, the IC package 12 is guided by the guide portions 19b, rested and positioned on the predetermined position of the accommodation surface portion 19a of the top plate 19, and the respective solder balls 12b of the IC package 12 are inserted between the opened paired contact portions 15e and 15f of the contact pins 15, respectively, in a non-contact state as shown in FIG. 13B.

Thereafter, when the downward pressing force to the operation member 21 is released, the operation member 21 is moved upward by the urging force of the spring 27, and hence, the movable member 17 is also moved upward by the spring 22. In this instance, the latch 28 is rotated in the direction to be closed by the urging force of the spring 30.

At the time when the movable member 17 is moved upward, the pressing force applied to the bent portions 15g of the contact pin 15 from the cam portion 17a is released, and from the state shown in FIGS. 13A, 13B, the paired contact portions 15e and 15f are moved in their closing (width narrowing) direction to thereby clamp the solder ball 12b therebetween.

Therefore, according to the motions described above, the solder balls 12b of the IC package 12 and the printed circuit board, not shown, can be electrically connected through the contact pins 15, respectively.

In the meantime, when it is required to remove the IC package 12 from the mounted state, the operation member 21 is lowered, so that the paired contact portions 15e and 15f of the contact pin 15 are separated from the solder ball 12b, and the IC package 12 can be hence removed by a force weaker than a force required for withdrawing the solder ball 12b from the state clamped between the paired contact portions 15e and 15f.

Further, it is to be noted that the present invention is not limited to the embodiments described above and many other changes and modifications may be made without departing from the scope of the appended claims.

That is, for example, although the present invention is applied to the IC socket 11, in the described embodiment, as "socket for electrical parts", the present invention is not limited to such described embodiment and is applicable to another device. Moreover, the present invention is applied to the IC socket 11 for the BGA type IC package 12, but it may be applicable to an IC socket for a PGA type IC package. Furthermore, although, in the described embodiment, there is adopted the structure that the flat surface portions 23d and 24d are formed to the pressing portions 23b and 24b of the lever members 23 and 24 so as to achieve surface-to-surface contact to the pressed portion 17c, the present invention is not limited to such structure and such the surface-to-surface contact may be achieved by forming same R-shaped portions to both the pressing portions and pressed portions.

In addition, in the described embodiment, the movable member 17 is constructed to be vertically movable with respect to the socket body 13, but the movable member may be constructed to be horizontally or obliquely movable in accordance with the rotational or pivotal motion of the lever members.

What is claimed is:

1. A socket for an electrical part having a socket body to which an electrical part is accommodated, said socket body being provided with a number of contact pins which are contacted to or separated from terminals of the electrical part, a movable member urged by a spring and arranged to be movable with respect to the socket body, and a lever member mounted to the socket body to be rotatable, in which when the lever member is rotated, the movable member is moved to thereby displace the contact pins so as to be contacted to or separated from the terminals of the electrical part, respectively, wherein said lever member is formed with a pressing portion which acts to press a portion of the movable member in accordance with the rotation of the lever member and, when said movable member is moved against the urging force of the spring so as to approach a lowermost position thereof by the rotation of the lever member with maximum stress thereby exerted on the movable member by the urging force of the spring, said pressing portion of the lever member and the pressed portion of the movable member achieve surface-to-surface contact to each other.

2. The socket for an electrical part according to claim 1, wherein said socket body is further provided with an operation member to be vertically movable with respect thereto, and when the operation member is lowered in the vertical direction, the lever member is rotated and the movable member is moved to displace the contact pins by the rotation of the lever member so as to be contacted to or separated from the terminals of the electrical part.

3. The socket for an electrical part according to claim 1, wherein said lever member is formed from metal plate, said movable member is formed from synthetic resin, said pressed portion of the movable member is formed with a flat surface portion and said pressing portion of the lever member is formed with a flat surface portion so that when the lever member is rotated to move the movable member so as to approach the lowermost position, the flat surface portion of the pressing portion of the lever member and the flat surface portion of the pressed portion of the movable member achieves surface-to-surface contact to each other.

4. A socket for an electrical part comprising:
a socket body to which an electrical part is mounted and provided with a number of contact pins to be contacted or separated from terminals of the electrical part;
a movable member mounted to the socket body to be vertically movable with respect thereto and urged by a spring; and
a lever member mounted to the socket body to be rotatable, said lever member being formed with a pressing portion and said movable member being formed with a portion to be pressed by the pressing portion of the lever member, wherein, when the lever member is rotated and the movable member is thereby moved against the urging force of the spring to approach a lowermost position of the movable member in a vertical movement direction thereof with maximum stress thereby exerted on the movable member by the urging force of the spring, said pressing portion of the lever member and said pressed portion of the movable member achieve surface-to-surface contact to each other.

5. The socket for an electrical part according to claim 4, further comprising an operation member mounted to the socket body to be vertically movable, wherein said operation member is lowered in the vertical direction thereof, said lever member is rotated and said movable member is then moved.

6. The socket for an electrical part according to claim 4, wherein said pressed portion of the movable member is formed with a flat surface portion and said pressing portion of the lever member is formed with a flat surface portion so that when the lever member is rotated to move the movable member, the flat surface portion of the pressing portion of the lever member and the flat surface portion of the pressed portion of the movable member achieve surface-to-surface contact to each other.

7. The socket for electrical part according to claim 1, wherein said lever member includes two set of paired levers, each set of which is arranged to one side of the socket, said paired levers provide an X-shape in arrangement and are pivotal about shafts formed to the socket body, said paired levers being provided with pressing portions and said movable member being formed with portions to be pressed by the pressing portions of the levers when said levers are rotated.

8. The socket for an electrical part according to claim 7, wherein guide wall sections are formed to respective side of said socket body so as to cover the paired levers on both the sides to prevent the levers from coming off from the socket body.

9. The socket for an electrical part according to claim 4, wherein said socket is an IC socket and said electrical part is an IC package.

10. A socket for an electrical part according to claim 1, wherein the pressing portion of the lever member and the pressed portion of the movable member each has a flat surface contact area.

11. A socket for an electrical part according to claim 10, wherein the flat surface contact areas are formed through a press working.

12. A socket for an electrical part according to claim 6, wherein the flat surface portions are formed through a press working.

13. A socket for an electrical part according to claim 1, wherein a surface contact area of the pressing portion of the lever member and a surface contact area of the pressed portion of the movable member each has a curved surface.

14. A socket for an electrical part according to claim 4, wherein a surface contact area of the pressing portion of the lever member and a surface contact area of the pressed portion of the movable member each has a curved surface.

15. A socket comprising:
a socket body to which an electrical part is accommodated;
contact pins on the socket body, each contact pin being contacted to or separated from a corresponding terminal of the electrical part;
a movable member urged by a spring and movable with respect to the socket body;
a lever member mounted to the socket body and rotatable so that, when the lever member is rotated, the movable member is moved to thereby displace the contact pins so as to be contacted to or separated from the terminals of the electrical part, the lever member being formed with a pressing portion which acts to press a portion of the movable member in accordance with the rotation of the lever member,
wherein, when the movable member is moved against the urging force of the spring so as to approach a lowermost position of the movable member by the rotation of the lever member with maximum stress thereby exerted on the movable member by the urging force of the spring, the pressing portion of the lever member and the pressed portion of the movable member achieve surface-to-surface contact to each other.

16. A socket according to claim 15, wherein the pressing portion of the lever member and the pressed portion of the movable member each has a flat surface contact area.

17. A socket according to claim 15, wherein a surface contact area of the pressing portion of the lever member and a surface contact area of the pressed portion of the movable member each has a curved surface.

18. A socket comprising:
a socket body to which an electrical part is accommodated;
contact pins on the socket body, each contact pin being contacted to or separated from a corresponding terminal of the electrical part;
a movable member movable with respect to the socket body and being urged by a spring in an upward direction; and a lever member mounted to the socket body and rotatable so that, when the lever member is rotated, the movable member is moved to thereby displace the contact pins so as to be contacted to or separated from the corresponding terminals of the electrical part, the lever member being formed with a pressing portion which acts to press a portion of the movable member in accordance with the rotation of the lever member, wherein when, by the rotation of the lever member, the movable member is moved in a downward direction against the urging force of the spring so as to approach a lowermost position of the movable member with maximum stress thereby exerted on the movable member by the urging force of the spring, the pressing portion of the lever member and the pressed portion of the movable member achieve surface-to-surface contact to each other.

19. A socket according to claim 18, wherein the pressing portion of the lever member and the pressed portion of the movable member each has a flat surface contact area.

20. A socket according to claim 18, wherein a surface contact area of the pressing portion of the lever member and a surface contact area of the pressed portion of the movable member each has a curved surface.

* * * * *